United States Patent
Jung (10) Patent No.: US 10,885,623 B2
(45) Date of Patent: Jan. 5, 2021

(54) METHODS OF DETECTING JOINT FAILURES BETWEEN STACKED SEMICONDUCTOR DIES

(71) Applicant: SK hynix Inc., Icheon-si (KR)

(72) Inventor: Hae Won Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 106 days.

(21) Appl. No.: 16/186,261

(22) Filed: Nov. 9, 2018

(65) Prior Publication Data
US 2019/0318470 A1    Oct. 17, 2019

(30) Foreign Application Priority Data

Apr. 12, 2018 (KR) .................. 10-2018-0042962

(51) Int. Cl.
G06K 9/00 (2006.01)
G06T 7/00 (2017.01)
H01L 25/065 (2006.01)

(52) U.S. Cl.
CPC ........ *G06T 7/0004* (2013.01); *H01L 25/0657* (2013.01); *G06T 2207/10048* (2013.01); *G06T 2207/30148* (2013.01); *H01L 2225/06513* (2013.01); *H01L 2225/06541* (2013.01); *H01L 2225/06589* (2013.01); *H01L 2225/06596* (2013.01)

(58) Field of Classification Search
CPC .................. G06T 7/0004; G06T 7/001; G06T 2207/10048; G06T 2207/30148; G01N 21/9501; G01N 21/95607; H01L 25/0657; H01L 2225/06596; H01L 2225/06589; H01L 2225/06513; H01L 2225/06541
See application file for complete search history.

(56) References Cited

U.S. PATENT DOCUMENTS 5,984,522 A    11/1999    Koizumi
7,575,981 B2 *  8/2009    Lee ................... H01L 21/76232
                                                257/E21.546

(Continued)

OTHER PUBLICATIONS

Heesang Park et al., "Microscopy Infrared Thermography System and Application," Journal of the Korean Society for Nondestructive Testing, 2013, p. 382-387, vol. 33.

*Primary Examiner* — Amir Alavi
(74) *Attorney, Agent, or Firm* — William Park & Associates Ltd.

(57) ABSTRACT

A method of detecting a joint failure of a semiconductor die stack is provided. The method may include providing the semiconductor die stack including a base substrate, a lower semiconductor die stacked on the base substrate, and an upper semiconductor die stacked on the lower semiconductor die opposite to the base substrate. The lower semiconductor die may include first through silicon vias (TSVs). Heat may be supplied to a bottom surface of the base substrate opposite to the lower semiconductor die. A thermographic image of a top surface of the upper semiconductor die opposite to the lower semiconductor die may be obtained. Whether the joint failure exists in the semiconductor die stack may be discriminated, with the thermographic image, based on a temperature difference between regions of the thermographic image corresponding with regions of the first TSVs.

9 Claims, 5 Drawing Sheets

(56) References Cited

U.S. PATENT DOCUMENTS

| | | | | |
|---|---|---|---|---|
| 8,294,261 B2* | 10/2012 | Mawatari | ............ | H01L 23/3677 |
| | | | | 257/712 |
| 8,319,336 B2* | 11/2012 | Chang | ................... | H01L 21/486 |
| | | | | 257/718 |
| 8,426,257 B2* | 4/2013 | Park | .................... | H01L 23/5258 |
| | | | | 257/E21.215 |
| 8,791,562 B2* | 7/2014 | Lee | .................... | H01L 25/0655 |
| | | | | 257/612 |
| 9,412,736 B2* | 8/2016 | Ding | .................. | H01L 27/0694 |
| 9,601,461 B2* | 3/2017 | Ho | ....................... | H01L 25/0652 |
| 9,613,881 B2* | 4/2017 | Ahn | .................... | H01L 23/3677 |
| 2010/0127382 A1* | 5/2010 | Akahoshi | ................ | H01L 24/17 |
| | | | | 257/692 |
| 2019/0318470 A1* | 10/2019 | Jung | .................. | H01L 25/0657 |

\* cited by examiner

METHODS OF DETECTING JOINT FAILURES BETWEEN STACKED SEMICONDUCTOR DIES

CROSS-REFERENCE TO RELATED APPLICATIONS

The present application claims priority under 35 U.S.C 119(a) to Korean Application No. 10-2018-0042962, filed on Apr. 12, 2018, which is incorporated herein by references in its entirety.

BACKGROUND

1. Technical Field

Various embodiments generally relate to semiconductor package technologies and, more particularly, to methods of detecting joint failures between stacked semiconductor dies.

2. Related Art

Recently, semiconductor packages having high bandwidth and a large storage capacity have been required in various electronic systems. In response to such a demand, a lot of effort has been focused on improving a technique for vertically stacking a plurality of semiconductor dies to increase the number of semiconductor dies embedded in one semiconductor package. The plurality of semiconductor dies vertically stacked in the semiconductor package may be electrically connected to each other by interconnection structures which are comprised of through silicon vias (TSVs) and bumps. In such a case, the bumps may be used to electrically connect upper TSVs to lower TSVs. However, in some cases, a joint failure between two adjacent TSVs which are vertically aligned may occur to cause an electrical open failure.

SUMMARY

According to an embodiment, a method of detecting a joint failure of a semiconductor die stack is provided. The method may include providing the semiconductor die stack including a base substrate, a lower semiconductor die stacked on the base substrate, and an upper semiconductor die stacked on the lower semiconductor die opposite to the base substrate. The lower semiconductor die may include first through silicon vias (TSVs). Heat may be supplied to a bottom surface of the base substrate opposite to the lower semiconductor die. A thermographic image of a top surface of the upper semiconductor die opposite to the lower semiconductor die may be obtained. Whether the joint failure exists in the semiconductor die stack may be discriminated, with the thermographic image, based on a temperature difference between regions of the thermographic image corresponding with regions of the first TSVs.

According to an embodiment, a method of detecting a joint failure of a semiconductor die stack is provided. The method may include providing the semiconductor die stack including a base substrate, a lower semiconductor die stacked on the base substrate, and an upper semiconductor die stacked on the lower semiconductor die opposite to the base substrate. The lower semiconductor die may include first through silicon vias (TSVs). Heat may be supplied to a bottom surface of the base substrate opposite to the lower semiconductor die. Whether the joint failure exists in the semiconductor die stack may be discriminated based on a temperature difference, created by a joint failure, between regions that correspond with the first TSVs. The regions may be on a top surface of the upper semiconductor die opposite to the lower semiconductor die.

DETAILED DESCRIPTION

The terms used herein may correspond to words selected in consideration of their functions in embodiments of the present disclosure, and the meanings of the terms may be construed to be different according to ordinary skill in the art to which embodiments of the present disclosure belong. If defined in detail, the terms may be construed according to the definitions. Unless otherwise defined, the terms (including technical and scientific terms) used herein have the same meaning as commonly understood by one of ordinary skill in the art to which embodiments of the present disclosure belong.

It will be understood that although the terms "first," "second," "third," etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A semiconductor package may include electronic devices such as semiconductor chips or semiconductor dies. The semiconductor chips or the semiconductor dies may be obtained by separating a semiconductor substrate such as a wafer into a plurality of pieces using a die sawing process.

The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Embodiments of the present disclosure will be described in conjunction with a semiconductor package including a plurality of semiconductor dies which may be vertically stacked. The plurality of semiconductor dies may be electrically connected to each other by through silicon via (TSV) structures. Each of the TSV structures means an interconnection structure including a through electrode such as the TSV vertically penetrating the semiconductor die. The plurality of semiconductor dies may be electrically connected to each other by interconnection structures including the TSVs and bumps. The bumps may be connection members connected to the TSVs.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Embodiments of the present disclosure may provide methods of detecting joint failures between semiconductor dies which may be vertically stacked.

Figure 1:
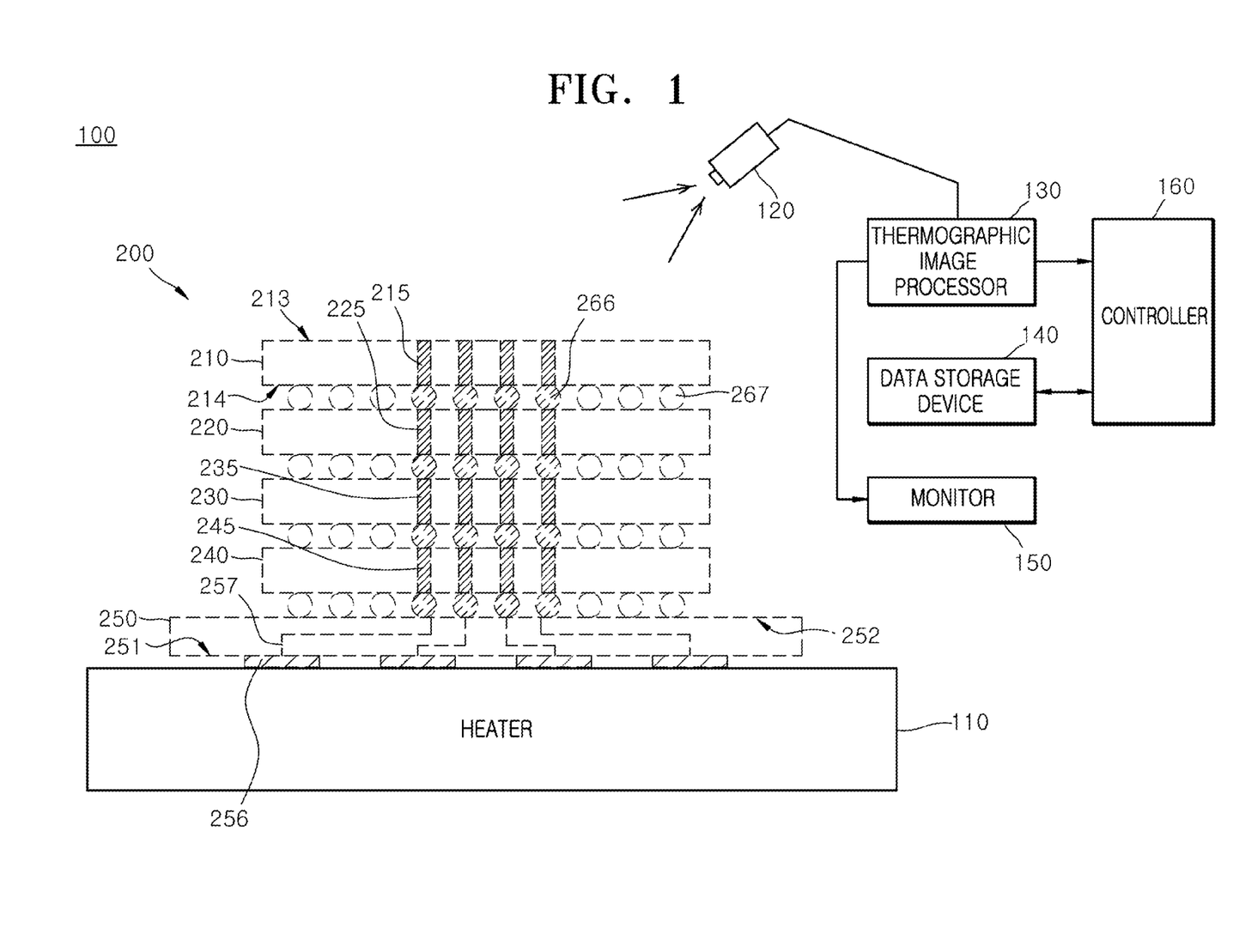
FIG. 1 is a schematic view illustrating an apparatus used in detection of joint failures in a semiconductor die stack and illustrating a method of detecting the joint failures in the semiconductor die stack using the apparatus, according to an embodiment.
Figure 2:
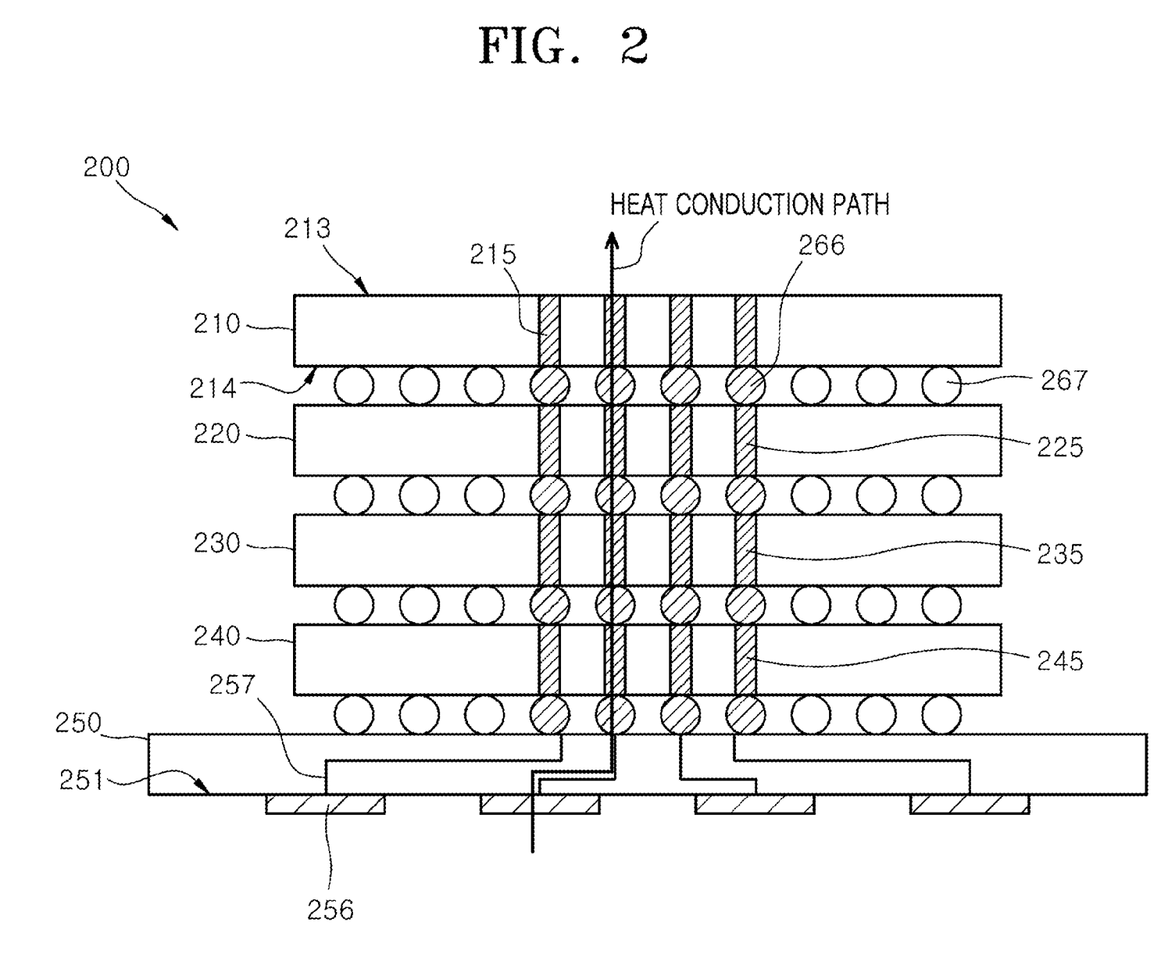
FIG. 2 is a cross-sectional view illustrating the semiconductor die stack illustrated in FIG. 1.

FIG. 1 is a schematic view illustrating an apparatus 100 used in detection of joint failures in a semiconductor die stack 200 and illustrating a method of detecting the joint failures in the semiconductor die stack 200 using the apparatus 100 according to an embodiment. FIG. 2 is a cross-sectional view illustrating the semiconductor die stack 200 illustrated in FIG. 1.

Referring to FIG. 1, the apparatus 100 for detecting joint failures of the semiconductor die stack 200 is illustrated. The apparatus 100 may include a stage 110 on which the semiconductor die stack 200 is mounted and a thermographic camera 120.

Referring to FIGS. 1 and 2, the semiconductor die stack 200 may include a plurality of semiconductor dies which are vertically stacked. The semiconductor die stack 200 may provide a high bandwidth memory (HBM) device of a three-dimensional stack device.

The semiconductor die stack 200 may include an upper semiconductor die 210 disposed on a surface of a base substrate 250. A first lower semiconductor die 220, a second lower semiconductor die 230, and a third lower semiconductor die 240 may be sequentially stacked on a surface of the base substrate 250 under the upper semiconductor die 210. For example, the third lower semiconductor die 240 may be stacked on a surface of the base substrate 250 opposite to the stage 110, the second lower semiconductor die 230 may be stacked on a surface of the third lower semiconductor die 240 opposite to the base substrate 250, the first lower semiconductor die 220 may be stacked on a surface of the second lower semiconductor die 230 opposite to the third lower semiconductor die 240, and the upper semiconductor die 210 may be stacked on a surface of the first lower semiconductor die 220 opposite to the second lower semiconductor die 230. If the semiconductor dies 240, 230, 220, and 210 are sequentially stacked on the base substrate 250, the upper semiconductor die 210 may correspond to a topmost semiconductor die of the semiconductor die stack 200. A top surface 213 of the upper semiconductor die 210 opposite to the first to third lower semiconductor dies 220, 230, and 240 may correspond to a top surface of the semiconductor die stack 200 and may be exposed outwardly. The thermographic camera 120 may be disposed to face the upper semiconductor die 210. The semiconductor die stack 200 may be mounted on the stage (110 of FIG. 1). A bottom surface 251 of the base substrate 250 may correspond to a bottom surface of the semiconductor die stack 200 and may face the stage 110.

The base substrate 250; the first to third lower semiconductor dies 220, 230, and 240; and the upper semiconductor die 210 may be electrically connected to each other by connectors 266 such as bumps. The upper semiconductor die 210 and the first to third lower semiconductor dies 220, 230, and 240 may include TSVs 215, TSVs 225, TSVs 235, and TSVs 245, respectively. The TSVs 215, TSVs 225, TSVs 235, and TSVs 245 may be connected to each other by the connectors 266. Dummy bumps 267 may be disposed between the upper semiconductor die 210; the first to third lower semiconductor dies 220, 230, and 240; and the base substrate 250. The dummy bumps 267 may be disconnected from the TSVs 215, 225, 235, and 245.

The upper semiconductor die 210 may be stacked on a surface of the first lower semiconductor die 220 opposite to the second lower semiconductor die 230. The first lower semiconductor die 220 may include the first TSVs 225 that substantially penetrate a body of the first lower semiconductor die 220. The upper semiconductor die 210 may include the second TSVs 215 that substantially penetrate a body of the upper semiconductor die 210. The second TSVs 215 may be conductive electrodes or conductive vias that extend from the top surface 213 of the upper semiconductor die 210 to a bottom surface 214 of the upper semiconductor die 210. First ends of the second TSVs 215 may be exposed at the top surface 213 of the upper semiconductor die 210.

The second TSVs 215 of the upper semiconductor die 210 may be vertically aligned with the first TSVs 225 of the first lower semiconductor die 220, respectively. The second TSVs 215 may be connected to the first TSVs 225 through some of the connectors 266, respectively.

The first lower semiconductor die 220 may be stacked on a surface of the second lower semiconductor die 230 opposite to the third lower semiconductor die 240. The second lower semiconductor die 230 may be stacked on a surface of the third lower semiconductor die 240 opposite to the base substrate 250. Accordingly, the second lower semiconductor die 230 and the third lower semiconductor die 240 may be stacked between the first lower semiconductor die 220 and the base substrate 250. The second lower semiconductor die 230 and the third lower semiconductor die 240 may be semiconductor dies having substantially the same shape and function as the first lower semiconductor die 220. The second lower semiconductor die 230 and the third lower semiconductor die 240 may include the third TSVs 235 and the fourth TSVs 245, respectively.

The third TSVs 235 may be vertically aligned with the first TSVs 225 of the first lower semiconductor die 220, respectively. In addition, the fourth TSVs 245 may be vertically aligned with the third TSVs 235, respectively. The third TSVs 235 may be connected to the fourth TSVs 245 through some of the connectors 266, respectively. The third TSVs 235 may also be connected to the first TSVs 225 through some of the connectors 266, respectively. Thus, the fourth TSVs 245, the third TSVs 235, the first TSVs 225, the second TSVs 215, and the connectors 266 disposed therebetween may constitute electrical paths. Theses electrical paths may also act as heat conduction paths that emit the heat of the semiconductor die stack 200 outwardly quickly.

The base substrate 250 on which the third lower semiconductor die 240 is stacked may be another semiconductor die. In some embodiments, the base substrate 250 may include an interconnection structure having internal connection lines 257. In some other embodiments, the base substrate 250 may be a printed circuit board (PCB). The internal connection lines 257 of the base substrate 250 may be connected to the fourth TSVs 245 through some of the connectors 266. The internal connection lines 257 of the base substrate 250 may be electrically connected to outer connectors 256 (e.g., conductive pads) that are disposed on the bottom surface 251 of the base substrate 250 opposite to the third lower semiconductor die 240.

A plurality of heat conduction paths may be provided between the bottom surface 251 of the base substrate 250 and the top surface 213 of the upper semiconductor die 210. That is, the outer connectors 256; the internal connection lines 257; the TSVs 245, 235, 225, and 215; and the connectors 266 may constitute the plurality of heat conduction paths.

Referring again to FIGS. 1 and 2, the semiconductor die stack 200 may be loaded onto the stage 110 of the apparatus 100 for detecting joint failures of the semiconductor die stack 200. The stage 110 may include a means for generating heat, for example, a heater or an infrared lamp. The stage 110 may supply heat to the bottom surface 251 of the base substrate 250. A thermographic image of a top surface (i.e., the top surface 213) of the semiconductor die stack 200 may be obtained using the thermographic camera 120. The thermographic image obtained by the thermographic camera 120 may be processed by a thermographic image processor 130 included in the apparatus 100 to generate thermographic image data. The thermographic image data generated by the thermographic image processor 130 may be transmitted to a monitor 150 included in the apparatus 100 to display the thermographic image. The thermographic image data generated by the thermographic image processor 130 may also be transmitted to a controller 160 included in the apparatus 100, and the controller 160 may analyze the thermographic image data to discriminate whether the semiconductor die stack 200 includes joint failures and to find out positions of the joint failures if the semiconductor die stack 200 includes the joint failures. The controller 160 may send the thermographic image data to a data storage device 140 such that the data storage device 140 stores the thermographic image data.

Figure 3:
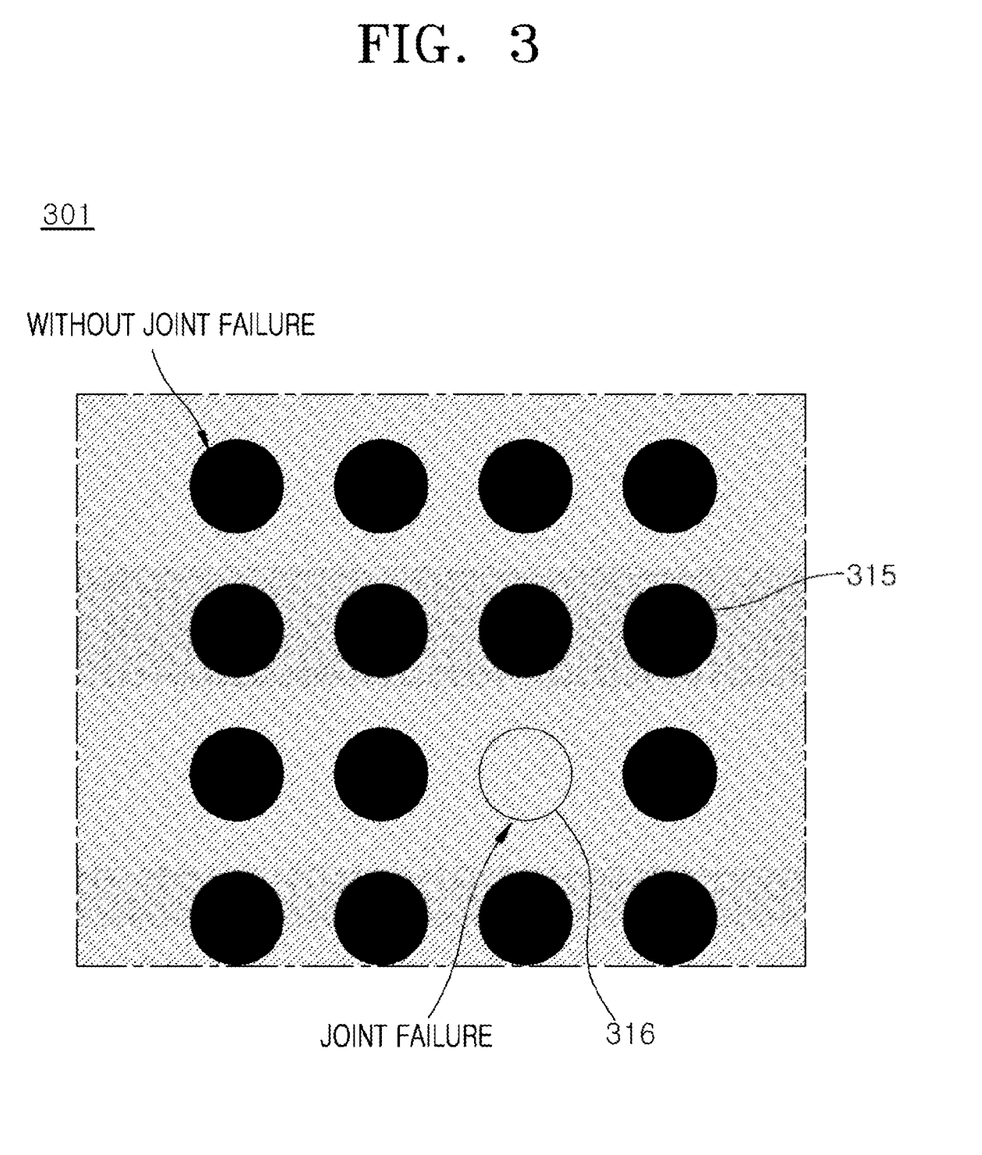
FIG. 3 is a thermographic image obtained according to an embodiment.

FIG. 3 illustrates a thermographic image 301 of the top surface 213 of the upper semiconductor die 210. According to the thermographic image 301, regions of the second TSVs 215 may be displayed by a dark color tone corresponding to a relatively high temperature. A region between the second TSVs 215 may be displayed by a light color tone corresponding to a relatively low temperature. That is, various color tones corresponding to different temperatures may be reflected in the thermographic image 301. The heat generated by the stage 110 may be quickly conducted to the second TSVs 215 through the heat conduction paths. Thus, a temperature distribution of the second TSVs 215 may be read out from the thermographic image 301.

Referring to FIGS. 1 and 3, if all of the electrical paths including the second TSVs 215 are normally formed without any joint failures, the heat generated by the stage 110 may be normally emitted outwardly through the electrical paths (i.e., all of the second TSVs 215) after the semiconductor die stack 200 is loaded on the stage 110. In such a case, the heat generated by the stage 110 may be quickly conducted from the stage 110 toward the second TSVs 215 through all of the electrical paths. Thus, the second TSVs 215 of the upper semiconductor die 210 may have a temperature which is higher than a temperature of a body of the upper semiconductor die 210.

Meanwhile, if a joint failure occurs in any one of all of the electrical paths including the second TSVs 215, the electrical path having the joint failure cannot normally conduct the heat generated by the stage 110. Thus, a temperature of the second TSV 215 included in the electrical path having the joint failure may be lower than temperatures of the second TSVs 215 included in the electrical paths without the joint failure. In such a case, the thermographic image 301 may show a color tone difference between the second TSV 215 included in the electrical path having the joint failure and the other second TSVs 215 included in the electrical paths without the joint failure, as illustrated in FIG. 3. Accordingly, the electrical path including the second TSV 215 having a relatively light color tone may be regarded as a failed electrical path. For example, the thermographic image 301 illustrates regions 315 of a dark color tone that correspond to regions of the second TSVs 215 without joint failure. For example, the thermographic image 301 illustrates regions 316 of a light color tone that correspond to regions of the second TSVs 215 having a joint failure. In some embodiments, the regions of the second TSVs 215 corresponding to the thermographic image regions 315 and 316 are located on a top surface 213 of the upper semiconductor die 210. In other embodiments, the regions of the electrical path corresponding to the thermographic image regions 315 and 316 may be a portion of the electrical path located anywhere between a top surface 213 of the upper semiconductor die 210 and a top surface 252 of the base substrate 250. As illustrated in FIG. 1, the top surface 252 of the base substrate 250 may be opposite to the bottom surface 251 of the base substrate 250. For example, a region of the electrical path corresponding to the thermographic image regions 315 and 316 may be a portion of fourth TSVs 245, third TSVs 235, second TSVs 215, first TSVs 225, or connectors 266.

Figure 4:
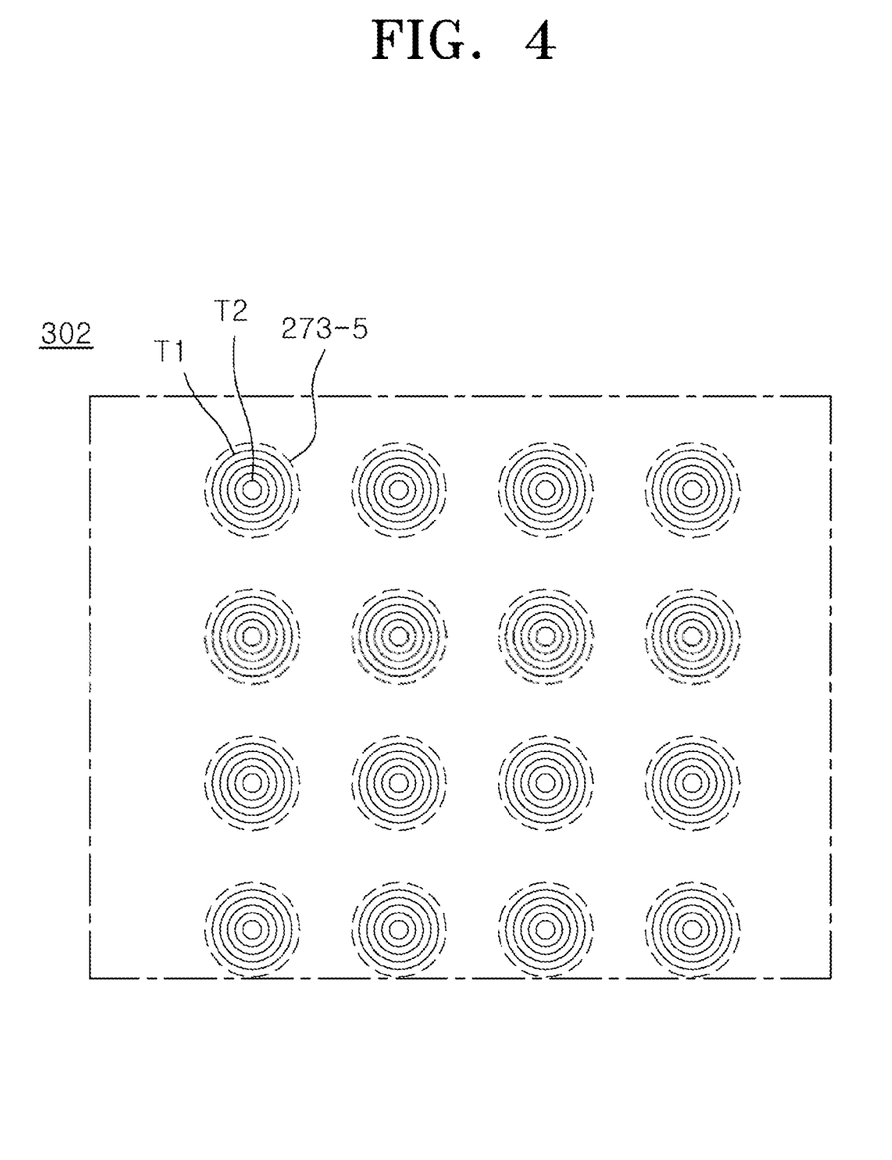
FIGS. 4 and 5 are temperature distribution diagrams generated from thermographic images obtained according to an embodiment.

FIG. 4 is a temperature distribution diagram 302 of the top surface 213 of the upper semiconductor die 210 included in the semiconductor die stack 200. The temperature distribution diagram 302 may be generated from the thermographic image obtained by the thermographic camera 120. That is, the thermographic image 301 illustrated in FIG. 3 may be converted (i.e., processed) into data of the temperature distribution diagram 302. The thermographic image 301 of FIG. 3 may additionally be converted (i.e., processed) by the thermographic image processor (130 of FIG. 1) to provide the data of the temperature distribution diagram 302. The temperature distribution diagram 302 may be illustrated by a plurality of contour lines including a first contour line T1 corresponding to a relatively low temperature and a second contour line T2 corresponding to a relatively high temperature.

Referring to FIGS. 2 and 4, regions 273-5 of the temperature distribution diagram 302 correspond to regions at the top surface 213 of the upper semiconductor die 210 that are electrically connected to the first TSVs 225 and thus may have a relatively high temperature if there is no joint failure in the electrical path. Other regions, for example as illustrated in FIG. 5, of the temperature distribution diagram 303 may correspond to regions at the top surface 213 of the upper semiconductor die 210 that indicate a joint failure in the electrical path or electrical disconnect in the first TSVs 225 and thus may have a relatively low temperature.

In an embodiment, referring to FIGS. 2 and 4, regions 273-5 of the temperature distribution diagram 302 may overlap with regions of the first TSVs 225 at the top surface 213 of the upper semiconductor die 210 and these regions 273-5 may indicate a relatively high temperature corresponding to an electrical path in the semiconductor die stack 200 that does not have an electrical disconnect. In contrast, regions of the temperature distribution diagram 302 corresponding to regions not overlapping with the first TSVs 225 at the top surface 213 of the upper semiconductor die 210 may have a relatively low temperature.

The semiconductor die stack 200 may include a plurality of heat conduction paths which are comprised of the outer connectors 256; the internal connection lines 257; the TSVs 245, 235, 225, and 215 vertically aligned with each other; and the connectors 266 between the TSVs 245, 235, 225, and 215. If the plurality of heat conduction paths are normally formed without any joint failures, the heat generated by the stage 110 may be quickly conducted to the second TSV 215 through the heat conduction paths. In such a case, the regions 273-5 of the temperature distribution diagram 302 overlapping with regions of the first TSVs 225 may be locally and quickly heated up as compared with other regions of the temperature distribution diagram 302 non-overlapping with the first TSVs 225 that correspond to such regions of the semiconductor die stack 200 that are not in the electrical paths of the first TSVs 225. As a result, the regions 273-5 overlapping with the first TSVs 225 may be displayed as relatively high temperature regions. Thus, the temperature distribution diagram 302 illustrated in FIG. 4 may be obtained.

Figure 5:
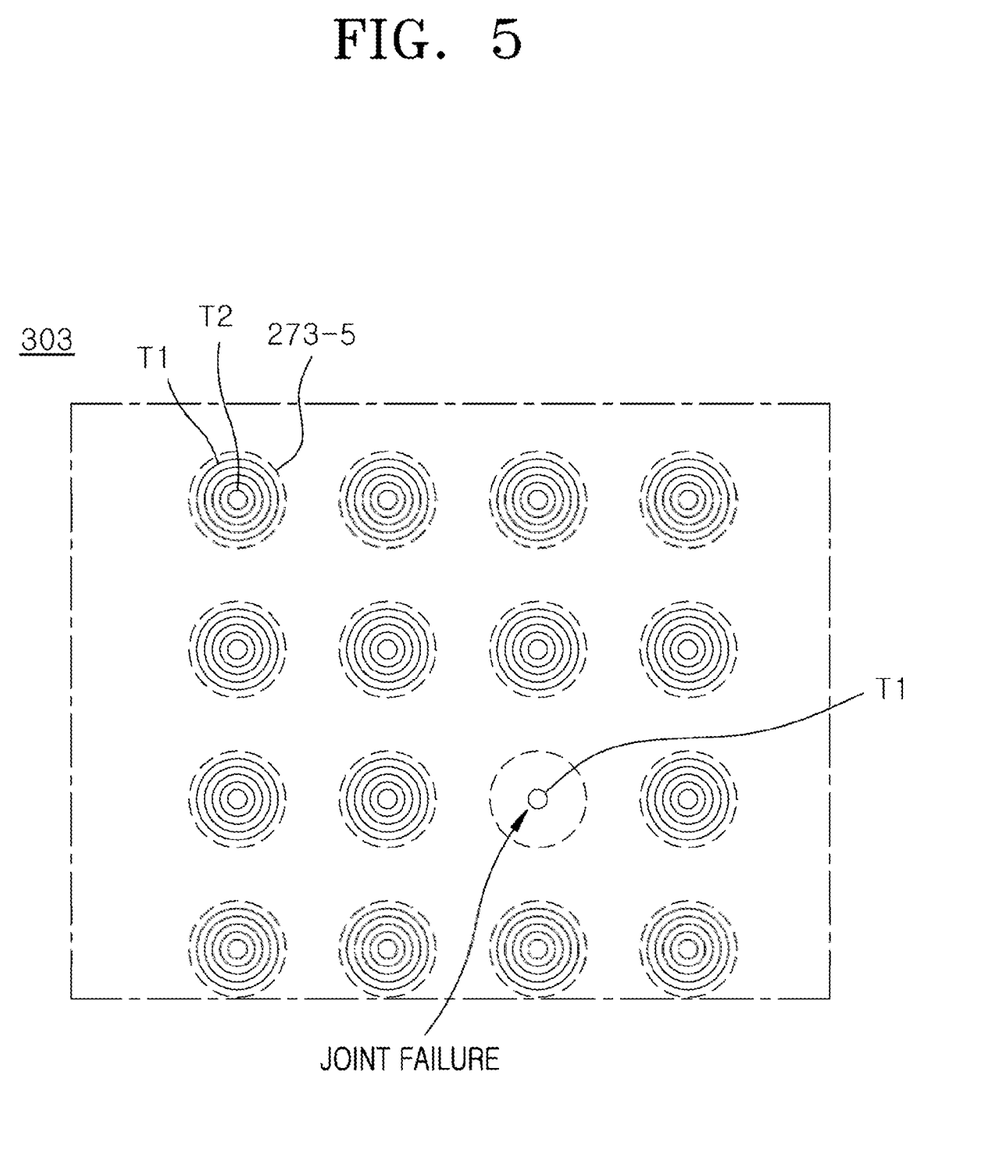

In a temperature distribution diagram 303 illustrated in FIG. 5, a joint failure region may be indicated by a relatively low temperature region. For example, if a joint failure occurs in any one of the heat conduction paths, the heat conduction path having the joint failure may malfunction. Thus, the heat generated by the stage 110 may be conducted to the second TSV 215 through the heat conduction path having the joint failure at a relatively low speed. Thus, a region of the temperature distribution diagram 303 overlapping with the heat conduction path of the semiconductor die stack 200 having the joint failure may indicate a relatively low temperature. This may be due to a difference between a heat conduction speed of normal heat conduction paths without any joint failures (e.g., when vertically aligned TSVs 225, 235, and 245 are normally connected to a respective second TSV 215 in the upper semiconductor die 210) and a heat conduction speed of an abnormal heat conduction path having the joint failure (e.g., when vertically aligned TSVs 225, 235, and 245 are abnormally disconnected from a respective second TSV 215 in the upper semiconductor die 210 due to a joint failure). A region indicated by only the first contour line T1 corresponding to a relatively low temperature among the regions 273-5 overlapping with the first TSVs (225 of FIG. 2) may have a relatively low temperature. Thus, the region indicated by only the first contour line T1 may be regarded as a joint failure region.

As described above, the joint failure of the semiconductor die stack (200 of FIG. 2) may be detected using the temperature distribution diagrams 302 and 303 (including temperature contour lines) illustrated in FIGS. 4 and 5. However, the present disclosure is not limited thereto. For example, the joint failure of the semiconductor die stack (200 of FIG. 2) may also be detected using a color tone difference in the thermographic image 301 described with reference to FIG. 3.

Referring again to FIG. 1, a method of detecting the joint failure may be achieved by using a phenomenon that heat applied to the base substrate 250 is quickly conducted to the second TSVs 215 of the upper semiconductor die 210 through the TSVs 245, 235, and 225 which are vertically aligned and connected.

The method of detecting the joint failure may be achieved by finding out a location of the joint failure from, for example, the thermographic image 301 illustrated in FIG. 3 or the temperature distribution diagrams 302 and 303 obtained from the thermographic image 301. Alternatively, the method of detecting the joint failure may be achieved by discriminating whether the semiconductor die stack 200 includes the joint failure using, for example, the thermographic image 301 illustrated in FIG. 3 or the temperature distribution diagrams 302 and 303 obtained from the thermographic image 301. The methods of detecting the joint failure according to embodiments described above may be effectively applied to stack packages, each of which includes a plurality of semiconductor dies which may be vertically stacked.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A method of detecting a joint failure of a semiconductor die stack, the method comprising:
    providing the semiconductor die stack including a base substrate, a lower semiconductor die stacked on the base substrate, and an upper semiconductor die stacked on the lower semiconductor die opposite to the base substrate, wherein the lower semiconductor die includes first through silicon vias (TSVs);
    supplying heat to a bottom surface of the base substrate opposite to the lower semiconductor die;
    obtaining a thermographic image of a top surface of the upper semiconductor die opposite to the lower semiconductor die; and
    discriminating, with the thermographic image, whether the joint failure exists in the semiconductor die stack based on a temperature difference between regions of the thermographic image, the regions of the thermographic image corresponding with regions of the first TSVs.

2. The method of claim 1, wherein the temperature difference is due to a phenomenon that a heat conduction speed of the first TSVs normally connected to the upper semiconductor die is different from a heat conduction speed of the first TSVs abnormally disconnected from the upper semiconductor die.

3. The method of claim 1, wherein discriminating whether the joint failure exists in the semiconductor die stack includes regarding regions having a relatively low temperature among the regions of the thermographic image, the regions indicating the relatively low temperature corresponding with regions of the first TSVs that include a joint failure.

4. The method of claim 1,
wherein the upper semiconductor die includes second TSVs, and
wherein the second TSVs penetrate a body of the upper semiconductor die to be aligned with the first TSVs respectively.

5. The method of claim 4, wherein the second TSVs are exposed at the top surface of the upper semiconductor die.

6. The method of claim 1,
wherein connectors electrically connect the first TSVs of the lower semiconductor die to the base substrate, and configured to connect the first TSVs of the lower semiconductor to the upper semiconductor die.

7. The method of claim 1, further comprising a plurality of additional lower semiconductor dies which are vertically stacked between the lower semiconductor die and the base substrate,
wherein each of the plurality of additional lower semiconductor dies includes a plurality of TSVs which are vertically aligned with the first TSVs respectively.

8. A method of detecting a joint failure of a semiconductor die stack, the method comprising:
providing the semiconductor die stack including a base substrate, a lower semiconductor die stacked on the base substrate, and an upper semiconductor die stacked on the lower semiconductor die opposite to the base substrate, wherein the lower semiconductor die includes first through silicon vias (TSVs);
supplying heat to a bottom surface of the base substrate opposite to the lower semiconductor die; and
discriminating whether the joint failure exists in the semiconductor die stack based on a temperature difference, created by a joint failure, between regions that correspond with the first TSVs,
wherein the regions are on a top surface of the upper semiconductor die opposite to the lower semiconductor die, and
wherein the temperature difference is due to a phenomenon in which a heat conduction speed of the first TSVs that is normally connected to the upper semiconductor die is different from a heat conduction speed of the first TSVs that are abnormally disconnected from the upper semiconductor die.

9. The method of claim 8, further comprising:
obtaining a thermographic image of the top surface of the upper semiconductor die to discriminate temperature differences between the regions.

* * * * *